United States Patent
Wu et al.

(10) Patent No.: US 8,848,851 B2
(45) Date of Patent: Sep. 30, 2014

(54) OUTPUT SIGNAL ADJUSTMENT SYSTEM

(75) Inventors: Zhaolei Wu, Chengdu (CN); Guosheng Wu, Chengdu (CN)

(73) Assignee: IPGoal Microelectronics (SIChuan) Co., Ltd., Chengdu, Sichuan Province (CN)

(*) Notice: Subject to any disclaimer, the term of this patent is extended or adjusted under 35 U.S.C. 154(b) by 442 days.

(21) Appl. No.: 13/207,310

(22) Filed: Aug. 10, 2011

(65) Prior Publication Data
US 2012/0039427 A1 Feb. 16, 2012

(30) Foreign Application Priority Data
Aug. 12, 2010 (CN) .......................... 2010 1 0251780

(51) Int. Cl.
*H04L 7/00* (2006.01)
*H03K 17/16* (2006.01)
*H03K 17/687* (2006.01)

(52) U.S. Cl.
CPC .......... *H03K 17/166* (2013.01); *H03K 17/6871* (2013.01)
USPC ........... 375/371; 375/360; 375/372; 375/373; 375/374; 375/376; 327/134; 327/170; 327/172; 327/175; 370/503; 331/11

(58) Field of Classification Search
CPC ... H03K 17/6871; H03K 17/166; H03K 5/12; H03K 5/1534; H03K 5/1565; H03L 7/087; H03L 7/033; H04L 7/0087
USPC ................. 375/260, 371, 372, 373, 374, 376; 327/134, 170, 172, 175; 331/11; 370/503
See application file for complete search history.

(56) References Cited

U.S. PATENT DOCUMENTS

| | | | |
|---|---|---|---|
| 6,275,072 B1* | 8/2001 | Dally et al. ...................... 327/7 |
| 6,806,752 B2* | 10/2004 | Heyne .......................... 327/175 |
| 7,557,863 B2* | 7/2009 | Keating et al. ................ 348/497 |
| 7,622,972 B2* | 11/2009 | Dale et al. .................... 327/170 |
| 7,663,418 B2* | 2/2010 | Dale et al. .................... 327/170 |
| 2006/0038596 A1* | 2/2006 | Wang ............................ 327/158 |
| 2009/0284293 A1* | 11/2009 | Kim et al. .................... 327/175 |
| 2011/0264973 A1* | 10/2011 | Ma ................................ 714/736 |

* cited by examiner

*Primary Examiner* — Sophia Vlahos

(57) ABSTRACT

An output signal adjustment system includes a signal adjustment unit, a reference slope generating unit, a slope detecting unit, a voltage-to-current conversion unit, and a control unit. The slope detecting unit compares the slope of the rising and falling edges of the output signal of the reference slope generating unit with that of the signal adjustment unit and outputs a voltage signal. The voltage-to-current conversion unit converts the voltage signal into a current signal. Based on the current signal, the control unit outputs a control signal for controlling the adjustment of the signal adjustment unit to the slope of the rising and falling edges of the output signal. The output signal adjustment system can automatically adjust the slope of the rising and falling edges of the output signal, so that the output signal is insensitive to the packaging, the printed circuit board, the transmission line and other sender loads.

14 Claims, 1 Drawing Sheet

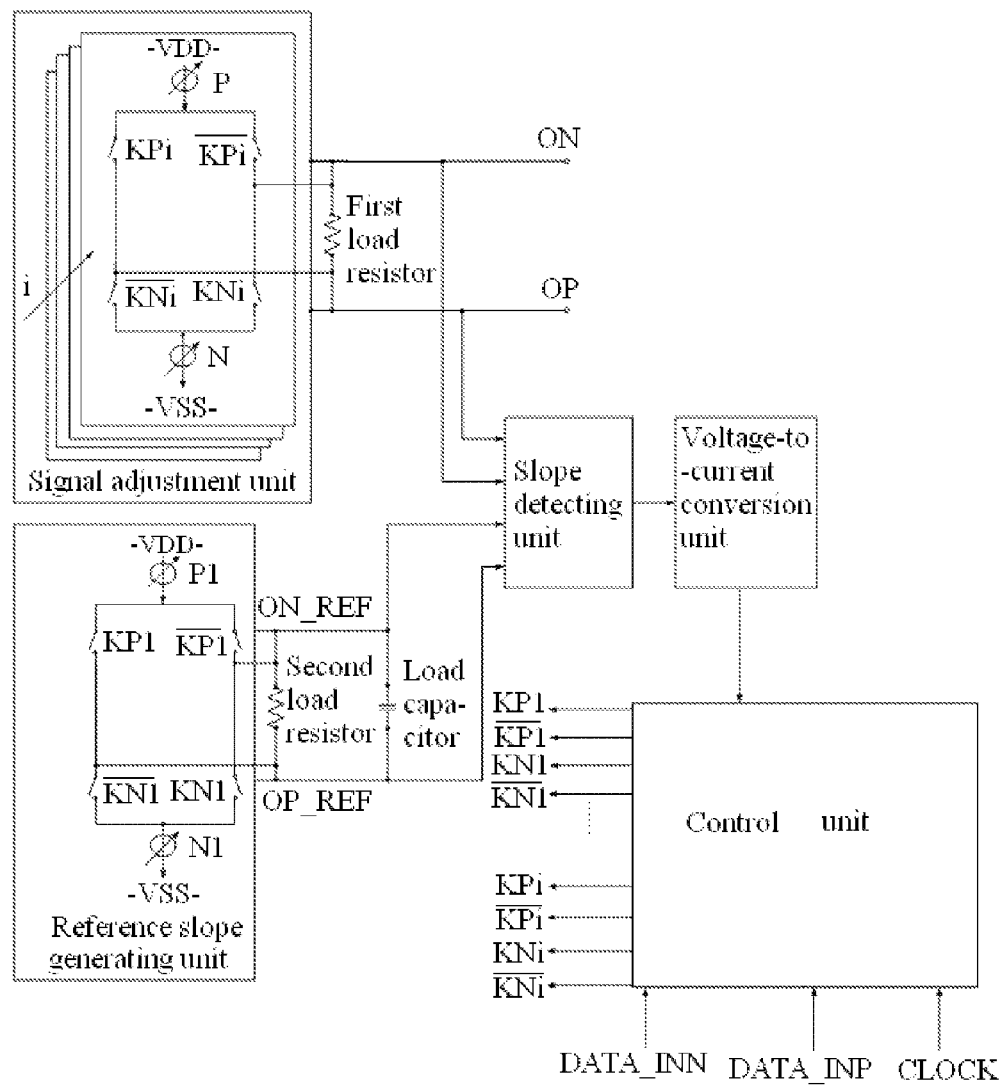

OUTPUT SIGNAL ADJUSTMENT SYSTEM

BACKGROUND OF THE PRESENT INVENTION

1. Field of Invention

The present invention relates to an adjustment system, and more particularly to an output signal adjustment system which is capable of automatically adjusting the slope of the rising and falling edges of the output signal of the sender of the high-speed data transmission system.

2. Description of Related Arts

In the high-speed data transmission system, due to the change of the packaging, the printed circuit board, the transmission line and other sender loads, the slope of the rising and falling edges of the output signal of the sender will be changed, thereby affecting the quality of the output signal of the sender.

When the capacitive reactance of the load is larger, the slope of the rising and falling edges of the output signal of the sender will be decreased. When the bit width of the output signal is very small, the energy of the high and low frequency of the output signal is seriously affected, thereby affecting the stability of the high-speed data transmission system. When the capacitive reactance of the load is smaller, the slope of the rising and falling edges of the output signal of the sender will be increased, due to the effect of the inductive reactance of the load, the output signal is overshot.

SUMMARY OF THE PRESENT INVENTION

An object of the present invention is to provide an output signal adjustment system which is capable of automatically adjusting the slope of the rising and falling edges of the output signal of the sender of the high-speed data transmission system.

Accordingly, in order to accomplish the above object, the present invention provides an output signal adjustment system, comprising:

a signal adjustment unit;

a reference slope generating unit for providing a reference slope of a rising edge and a falling edge of an output signal;

a slope detecting unit connected with the signal adjustment unit and the reference slope generating unit;

a voltage-to-current conversion unit connected with the slope detecting unit; and a control unit connected with the voltage-to-current conversion unit, wherein the slope detecting unit compares the reference slope of the rising and falling edges of the output signal of the reference slope generating unit with a slope of a rising edge and a falling edge of an output signal of the signal adjustment unit, and outputs a voltage signal to the voltage-to-current conversion unit, the voltage-to-current conversion unit converts the voltage signal into a current signal, the control unit outputs a control signal for controlling an adjustment of the signal adjustment unit to the slope of the rising and falling edges of the output signal based on the current signal.

Compared with the prior art, the output signal adjustment system of the present invention can automatically adjust the slope of the rising and falling edges of the output signal of the high-speed data transmission system, so that the output signal is insensitive to the packaging, the printed circuit board, the transmission line and other sender loads.

These and other objectives, features, and advantages of the present invention will become apparent from the following detailed description, the accompanying drawings, and the appended claims.

BRIEF DESCRIPTION OF THE DRAWINGS

The drawing is a system structure diagram of an output signal adjustment system according to a preferred embodiment of the present invention.

DETAILED DESCRIPTION OF THE PREFERRED EMBODIMENT

Referring to the drawing, an output signal adjustment system according to a preferred embodiment of the present invention is illustrated, wherein the output signal adjustment system comprises a signal adjustment unit, a reference slope generating unit, a slope detecting unit connected with the signal adjustment unit and the reference slope generating unit, a voltage-to-current conversion unit connected with the slope detecting unit, a control unit connected with the voltage-to-current conversion unit, a first load resistor, a second load resistor, a load capacitor, a first output end ON and a second output end OP.

The signal adjustment unit is adapted for adjusting the slope of the rising and falling edges of an output signal in the high-speed data transmission system. The reference slope generating unit is adapted for providing the reference slope of the rising and falling edges of an ideal output signal what the designer needs. The slope detecting unit is adapted for detecting the slope of the rising and falling edges of the output signal of the signal adjustment unit and the slope of the rising and falling edges of the output signal of the reference slope generating unit, and comparing the two slopes to output a voltage signal. The voltage-to-current conversion unit is adapted for converting the voltage signal outputted by the slope detecting unit into a current signal. The control unit is adapted for controlling the adjustment of the signal adjustment unit to the slope of the rising and falling edges of the output signal. The first load resistor and the second load resistor are respectively the loads of the signal adjustment unit and the reference slope generating unit. The load capacitor is the load of the reference slope generating unit. The first output end ON and the second output end OP respectively output a pair of differential signals.

The signal adjustment unit comprises i adjustment circuits, each of which having the same structure and connected with each other in parallel, wherein i>1. Every adjustment circuit comprises a first switch KPi, a second switch $\overline{KPi}$, a third switch KNi, a fourth switch $\overline{KNi}$, a first current source P and a second current source N. One end of the first switch KPi is connected with a power supply VDD through the first current source P, and the other end of the first switch KPi is connected with the second output end OP. One end of the second switch $\overline{KPi}$ is connected with the power supply VDD through the first current source P, and the other end of the second switch $\overline{KPi}$ is connected with the first output end ON. One end of the third switch KNi is connected with ground VSS through the second current source N, and the other end of the third switch KNi is connected with the first output end ON. One end of the fourth switch $\overline{KNi}$ is connected with ground VSS through the second current source N, and the other end of the fourth switch $\overline{KNi}$ is connected with the second output end OP. For example, when i=2, the signal adjustment unit comprises two adjustment circuits, wherein the first adjustment circuit comprises a first switch KP1, a second switch $\overline{KP1}$, a third switch KN1, and a fourth switch $\overline{KN1}$, wherein the second adjustment circuit comprises a first switch KP2, a second switch $\overline{KP2}$, a third switch KN2, and a fourth switch $\overline{KN2}$. Here, the number i of the adjustment circuits can be decided as required.

The reference slope generating unit comprises a first reference switch, a second reference switch, a third reference switch, a fourth reference switch, a first reference current source P1 and a second reference current source N1. The first reference switch, the second reference switch, the third reference switch and the fourth reference switch are respectively the first switch KP1, the second switch $\overline{KP1}$, the third switch KN1 and the fourth switch $\overline{KN1}$ of the first adjustment circuit of the signal adjustment unit. One end of the first reference switch is connected with the power supply VDD through the first reference current source P1, and the other end of the first reference switch is connected with a first reference output signal end OP_REF. One end of the second reference switch is connected with the power supply VDD through the first reference current source P1, and the other end of the second reference switch is connected with a second reference output signal end ON_REF. One end of the third reference switch is connected with ground VSS through the second reference current source N1, and the other end of the third reference switch is connected with the second reference output signal end ON_REF. One end of the fourth reference switch is connected with ground VSS through the second reference current source N1, and the other end of the fourth reference switch is connected with the first reference output signal end OP_REF.

The connection relations of the output signal adjustment system according the preferred embodiment of the present invention is described as follows. The first output end ON and the second output end OP of the signal adjustment unit are connected with the input end of the slope detecting unit. The first reference output signal end OP_REF and the second reference output signal end ON_REF of the reference slope generating unit are connected with the input end of the slope detecting unit. The first load resistor is provided between the first output end ON and the second output end OP. The second load resistor is connected with the load capacitor in parallel and provided between the first reference output signal end OP_REF and the second reference output signal end ON_REF. An output end of the slope detecting unit is connected with an input end of the voltage-to-current conversion unit. An output end of the voltage-to-current conversion unit is connected with the control unit. A first data DATA_INN, a second data DATA_INP and a clock signal CLOCK are respectively inputted into the input ends of the control unit, wherein the first data DATA_INN and the second data DATA_INP are a pair of differential data. The output ends of the control unit respectively output i control signals for controlling the reference slope generating unit and the signal adjustment unit. Some of the i control signals are adapted for respectively controlling the switch-on/off of the first reference switch, the second reference switch, the third reference switch and the fourth reference switch of the reference slope generating unit. The i control signals are adapted for respectively controlling the switch-on/off of every first switch KPi, every second switch $\overline{KPi}$, every third switch KNi and every fourth switch $\overline{KNi}$, so that the time at which the current is generated by every adjustment circuit of the signal adjustment unit is controlled by controlling the switching delay of every switch of the adjustment circuit of the signal adjustment unit.

The operational principle of the output signal adjustment system according to the preferred embodiment of the present invention is described as follows. Firstly, the first reference current source P1 and the second reference current source N1 of the reference slope generating unit are decided as required, thereby obtaining the reference slope of the rising and falling edges of the ideal output signal what is needed. Based on the first data DATA_INN, the second data DATA_INP and the clock signal CLOCK inputted from the input ends of the control unit, the control unit generates the control signals for controlling the switch-on/off of the switches of the reference slope generating unit and the signal adjustment unit. The slope detecting unit detects the difference between the slope of the rising and falling edges of the output signal of the signal adjustment unit and that of the reference slope generating unit, and outputs a voltage signal to the voltage-to-current conversion unit. The voltage-to-current conversion unit converts the voltage signal into a current signal and transfers the current signal to the control unit. Based on the received current signal, the control unit generates the control signals for controlling the switching delay of every switch of the signal adjustment unit. According to the switching delay of the first switch KPi, the second switch $\overline{KPi}$, the third switch KNi and the fourth switch $\overline{KNi}$ of every adjustment circuit, the time at which the current is generated by every adjustment circuit of the signal adjustment unit is controlled. According to the different time at which the current is generated by every adjustment circuit, the slope of the rising and falling edges of the output signal is changed, thereby adjusting the slope of the rising and falling edges of the output signal. If the slope detecting unit detects that the slope of the rising and falling edges of the output signal of the signal adjustment unit is larger, the delay between any two switches of every adjustment circuit is increased by the control signals outputted by the control unit, so that the interval between the time at which the current is generated by one adjustment circuit and the time at which the current is generated by another adjustment circuit is increased. Therefore, the slope of the rising and falling edges of the output signal is decreased. On the contrary, if the slope detecting unit detects that the slope of the rising and falling edges of the output signal of the signal adjustment unit is smaller, the delay between any two switches of every adjustment circuit is decreased by the control signals outputted by the control unit, so that the interval between the time at which the current is generated by one adjustment circuit and the time at which the current is generated by another adjustment circuit is shortened. Therefore, the slope of the rising and falling edges of the output signal is increased.

The output signal adjustment system of the present invention can automatically adjust the slope of the rising and falling edges of the output signal of the high-speed data transmission system, so that the output signal is insensitive to the packaging, the printed circuit board, the transmission line and other sender loads.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An output signal adjustment system, comprising:
   a signal adjustment unit;
   a reference slope generating unit providing a reference slope of a rising edge and a falling edge of an output signal;
   a slope detecting unit connected with said signal adjustment unit and said reference slope generating unit;

a voltage-to-current conversion unit connected with said slope detecting unit; and a control unit connected with said voltage-to-current conversion unit, wherein said slope detecting unit compares said reference slope of said rising and falling edges of said output signal of said reference slope generating unit with a slope of a rising edge and a falling edge of an output signal of said signal adjustment unit, and outputs a voltage signal to said voltage-to-current conversion unit, said voltage-to-current conversion unit converts said voltage signal into a current signal, said control unit outputs a control signal controlling an adjustment of said signal adjustment unit to said slope of said rising and falling edges of said output signal based on said current signal;

wherein said signal adjustment unit has a first output end and a second output end, and comprises at least two adjustment circuits connected with each other in parallel, wherein each of said adjustment circuits comprises a first switch, a second switch, a third switch, a fourth switch, a first current source and a second current source, wherein a first end of said first switch and a first end of said second switch are connected with a power supply through said first current source, a second end of said second switch is connected with said first output end, a second end of said first switch is connected with said second output end, a first end of said third switch and a first end of said fourth switch are connected with ground through said second current source, a second end of said third switch is connected with said first output end, and a second end of said fourth switch is connected with said second output end.

2. The output signal adjustment system, as recited in claim 1, wherein based on said current signal, said control unit controls a switching delay of said first switch, said second switch, said third switch and said fourth switch of each of said adjustment circuits changing a time at which a current is generated by each of said adjustment circuits, so that said slope of said rising and falling edges of said output signal is changed via said time.

3. The output signal adjustment system, as recited in claim 1, wherein said reference slope generating unit has a first reference output signal end and a second reference output signal end, and comprises a first reference switch, a second reference switch, a third reference switch, a fourth reference switch, a first reference current source and a second reference current source, wherein a first end of said first reference switch and a first end of said second reference switch are connected with said power supply through said first reference current source, a second end of said first reference switch is connected with said first reference output signal end, a second end of said second reference switch is connected with said second reference output signal end, a first end of said third reference switch and a first end of said fourth reference switch are connected with ground through said second reference current source, a second end of said third reference switch is connected with said second reference output signal end, a second end of said fourth reference switch is connected with said first reference output signal end.

4. The output signal adjustment system, as recited in claim 2, wherein said reference slope generating unit has a first reference output signal end and a second reference output signal end, and comprises a first reference switch, a second reference switch, a third reference switch, a fourth reference switch, a first reference current source and a second reference current source, wherein a first end of said first reference switch and a first end of said second reference switch are connected with said power supply through said first reference current source, a second end of said first reference switch is connected with said first reference output signal end, a second end of said second reference switch is connected with said second reference output signal end, a first end of said third reference switch and a first end of said fourth reference switch are connected with ground through said second reference current source, a second end of said third reference switch is connected with said second reference output signal end, a second end of said fourth reference switch is connected with said first reference output signal end.

5. The output signal adjustment system, as recited in claim 3, wherein said first output end and said second output end of said signal adjustment unit respectively output a pair of differential signals, said first reference output signal end and said second reference output signal end of said reference slope generating unit respectively output a pair of ideal differential signals.

6. The output signal adjustment system, as recited in claim 4, wherein said first output end and said second output end of said signal adjustment unit respectively output a pair of differential signals, said first reference output signal end and said second reference output signal end of said reference slope generating unit respectively output a pair of ideal differential signals.

7. The output signal adjustment system, as recited in claim 6, wherein said first output end and said second output end of said signal adjustment unit, and said first reference output signal end and said second reference output signal end of said reference slope generating unit are connected with an input end of said slope detecting unit.

8. The output signal adjustment system, as recited in claim 3, wherein said signal adjustment unit further comprises a first load resistor provided between said first output end and said second output end, said reference slope generating unit further comprises a second load resistor provided between said first reference output signal end and said second reference output signal end and a load capacitor connected with said second load resistor in parallel.

9. The output signal adjustment system, as recited in claim 4, wherein said signal adjustment unit further comprises a first load resistor provided between said first output end and said second output end, said reference slope generating unit further comprises a second load resistor provided between said first reference output signal end and said second reference output signal end and a load capacitor connected with said second load resistor in parallel.

10. The output signal adjustment system, as recited in claim 5, wherein said signal adjustment unit further comprises a first load resistor provided between said first output end and said second output end, said reference slope generating unit further comprises a second load resistor provided between said first reference output signal end and said second reference output signal end and a load capacitor connected with said second load resistor in parallel.

11. The output signal adjustment system, as recited in claim 6, wherein said signal adjustment unit further comprises a first load resistor provided between said first output end and said second output end, said reference slope generating unit further comprises a second load resistor provided between said first reference output signal end and said second reference output signal end and a load capacitor connected with said second load resistor in parallel.

12. The output signal adjustment system, as recited in claim 5, wherein a first data, a second data and a clock signal are respectively inputted into three input ends of said control unit, wherein said first data and said second data are a pair of differential data.

13. The output signal adjustment system, as recited in claim 6, wherein a first data, a second data and a clock signal are respectively inputted into three input ends of said control unit, wherein said first data and said second data are a pair of differential data.

14. An output signal adjustment system, comprising:
   a signal adjustment unit;
   a reference slope generating unit providing a reference slope of a rising edge and a falling edge of an output signal;
   a slope detecting unit connected with said signal adjustment unit and said reference slope generating unit;
   a voltage-to-current conversion unit connected with said slope detecting unit; and
   a control unit connected with said voltage-to-current conversion unit,
   wherein said slope detecting unit compares said reference slope of said rising and falling edges of said output signal of said reference slope generating unit with a slope of a rising edge and a falling edge of an output signal of said signal adjustment unit, and outputs a voltage signal to said voltage-to-current conversion unit, said voltage-to-current conversion unit converts said voltage signal into a current signal, said control unit outputs a control signal controlling an adjustment of said signal adjustment unit to said slope of said rising and falling edges of said output signal based on said current signal;
   wherein said reference slope generating unit has a first reference output signal end and a second reference output signal end, and comprises a first reference switch, a second reference switch, a third reference switch, a fourth reference switch, a first reference current source and a second reference current source, wherein a first end of said first reference switch and a first end of said second reference switch are connected with a power supply through said first reference current source, a second end of said first reference switch is connected with said first reference output signal end, a second end of said second reference switch is connected with said second reference output signal end, a first end of said third reference switch and a first end of said fourth reference switch are connected with ground through said second reference current source, a second end of said third reference switch is connected with said second reference output signal end, a second end of said fourth reference switch is connected with said first reference output signal end.

* * * * *